United States Patent
Lin et al.

(10) Patent No.: US 10,064,304 B2
(45) Date of Patent: Aug. 28, 2018

(54) SEPARATED SERVER BACK PLANE

(71) Applicant: Quanta Computer Inc., Taoyuan (TW)

(72) Inventors: Fa-Da Lin, Taoyuan (TW); Sheng-Hao Juang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 14/691,194

(22) Filed: Apr. 20, 2015

(65) Prior Publication Data

US 2016/0073541 A1    Mar. 10, 2016

Related U.S. Application Data

(60) Provisional application No. 62/047,551, filed on Sep. 8, 2014.

(51) Int. Cl.
| | |
|---|---|
| *H05K 7/14* | (2006.01) |
| *H05K 7/18* | (2006.01) |
| *H05K 7/20* | (2006.01) |

(52) U.S. Cl.
CPC ......... *H05K 7/1422* (2013.01); *H05K 7/1441* (2013.01); *H05K 7/1452* (2013.01);
(Continued)

(58) Field of Classification Search
CPC ........ G06F 3/0689; G06F 13/409; G06F 1/26; G06F 1/181; H05K 7/1487; H05K 7/1489;
(Continued)

(56) References Cited

U.S. PATENT DOCUMENTS

| | | | | |
|---|---|---|---|---|
| 4,426,850 A | * | 1/1984 | Reedy | F25D 29/005 62/125 |
| 6,657,861 B2 | * | 12/2003 | Irmer | H02B 1/50 174/383 |

(Continued)

FOREIGN PATENT DOCUMENTS

| | | |
|---|---|---|
| CN | 102478918 A | 5/2012 |
| CN | 103970216 A | 8/2014 |

(Continued)

OTHER PUBLICATIONS

TW third Office Action for Application No. 104126044, dated Jun. 1, 2017, w/ Office Action Summary.
(Continued)

*Primary Examiner* — Dimary Lopez Cruz
*Assistant Examiner* — Ingrid Wright
(74) *Attorney, Agent, or Firm* — Nixon Peabody LLP; Eduardo J. Quiñones

(57) ABSTRACT

A separated back plane design within a server rack is provided which allows for the hot-swapping of a control module board. The separated back plane design consists of a base plane board and a control module board which connects to the base plane board. The base plane board can draw power from a power supply and can connect a number of electrical components which are not significantly susceptible to damage or failure. The control module board can consist of a number of other electrical components, which are susceptible to damage or failure. The control module board connects to the base plane board, and can be removed during failure of the control module board. When the control module board is removed from the base plane board, the base plane board and its functions continue to operate, and power need not be shut off in order to replace the control module board.

21 Claims, 4 Drawing Sheets

(52) U.S. Cl.
CPC .......... *H05K 7/1492* (2013.01); *H05K 7/183* (2013.01); *H05K 7/1449* (2013.01); *H05K 7/1457* (2013.01); *H05K 7/1485* (2013.01); *H05K 7/2019* (2013.01)

(58) Field of Classification Search
CPC ............. H05K 7/1492; H05K 7/20554; H05K 7/20572; H05K 7/20727; H05K 7/20736; H05K 9/0007; H05K 7/1422; H05K 7/1441; H05K 7/1452; H05K 7/183; H05K 7/1449; H05K 7/2019; H05K 7/1457; H05K 7/1485
USPC ....... 361/724–727, 752, 785, 787, 788, 789, 361/679.01, 728, 760, 679.31–679.39; 312/223.1–223.2
See application file for complete search history.

(56) References Cited

U.S. PATENT DOCUMENTS

| | | | | |
|---|---|---|---|---|
| 7,437,496 B2 * | 10/2008 | Oster | .................... | G06F 13/409 361/728 |
| 2002/0091887 A1 * | 7/2002 | Reay | .................... | G06F 13/4081 710/300 |
| 2006/0194460 A1 * | 8/2006 | Chen | .................... | G06F 13/409 439/108 |
| 2007/0247825 A1 * | 10/2007 | Bynum | ................ | H05K 7/1439 361/788 |
| 2011/0096484 A1 * | 4/2011 | Hu | .......................... | G06F 1/183 361/679.02 |
| 2012/0327591 A1 | 12/2012 | Jau et al. | | |

FOREIGN PATENT DOCUMENTS

| | | |
|---|---|---|
| CN | 104345844 A | 2/2015 |
| TW | I411375 B | 10/2013 |

OTHER PUBLICATIONS

CN Office Action for Application No. 201510522108.1, dated Apr. 3, 2018, w/ Office Action Summary.
CN Search Report for Application No. 201510522108.1 (report conducted Mar. 26, 2018) mailed with First Office Action dated Apr. 3, 2018.

\* cited by examiner

SEPARATED SERVER BACK PLANE

CROSS-REFERENCE TO RELATED APPLICATIONS

The application claims priority to, and the benefit of, U.S. Provisional Patent Application No. 62/047,551, filed Sep. 8, 2014, the contents of which are herein incorporated by reference in their entirety.

FIELD OF THE INVENTION

The disclosure relates generally to server rack design, and specifically to a separated back plane design for a server rack.

BACKGROUND

Within server technology, the design of server racks is important to the function of power and electrical components in a server. In current rack design, a single back plane board is installed in the rack. A back plane (or backplane) is a simple motherboard designed with a number of minimal components, which can be connected and managed together in parallel. It typically serves as the interface for all of the major components within a server unit. A back plane is designed to allow major components to be added or removed with a small amount of effort. A back plane contains both passive components, such as the power supply, and active components, including integrated circuit components. This single back plane handles the management of each chassis installed in the rack. A typical back plane can contain connectors for a variety of components, including an input/output board, fans, processor boards, memory modules, and more.

In general, once the back plane fails and needs to be replaced with another back plane, it is typically necessary to shut down the power supply which is connected to it. However, other critical components of the server rack, such as cooling fans, also typically have their power supplied through this back plane as well. Accordingly, such components cannot function during the replacement of the back plane. This may lead to a number of problems, since the continuous operation of a server and its components may be essential to businesses and technical processes. This can lead to costly delays and loss of time and resources. High-availability and mission-critical systems such as servers need to be designed for near-zero downtime throughout their useful life. Several industries depend on constant server operation, including medical informatics, nuclear power, financial institutions, and persistent online games. Potential loss of data due to system outages can be significant, especially in applications which rely on massive, real-time data collection. In addition, data corruption can occur, leading to unexpected problems even several months after an outage. In some instances, back plane failure may result in loss of power to the fan modules while other components continue to operate. This can result in the running server chassis being placed at risk of damage, due to the absence of cooling from the deactivated fans.

SUMMARY

The present technology provides for a separated back plane design within a server rack. Rather than a single back plane board containing both strong and weak components and both active and passive components, the separated back plane design consists of a base plane board and a control module board. The base plane board connects to a server chassis, and contains a number of strong electrical components which are not significantly susceptible to damage or failure. Strong electrical components can include capacitors, resistors, conductors, inductors and other electrical components. In addition, the base plane board contains components which provide functions that are important for healthy server operation. The control module board can consist of a number of weak electrical components which are susceptible to damage or failure, such as integrated circuits. The control module board connects to the base plane board, and can be removed during failure of one or more components of the control module board. When the control module board is removed from the base plane board, the base plane board and its functions continue to operate, and power need not be shut off in order to replace the control module board. This is due to the separation of the weak components on the control module board, and the strong components on the base plane board.

In some embodiments, the base plane board contains connections to one or more fan modules. The fan modules can continue to operate and draw power through the base plane board without the control module board connected.

BRIEF DESCRIPTION OF THE DRAWINGS

Various embodiments or examples of the invention are disclosed in the following detailed description and the accompanying drawings.

DETAILED DESCRIPTION

Figure 1:
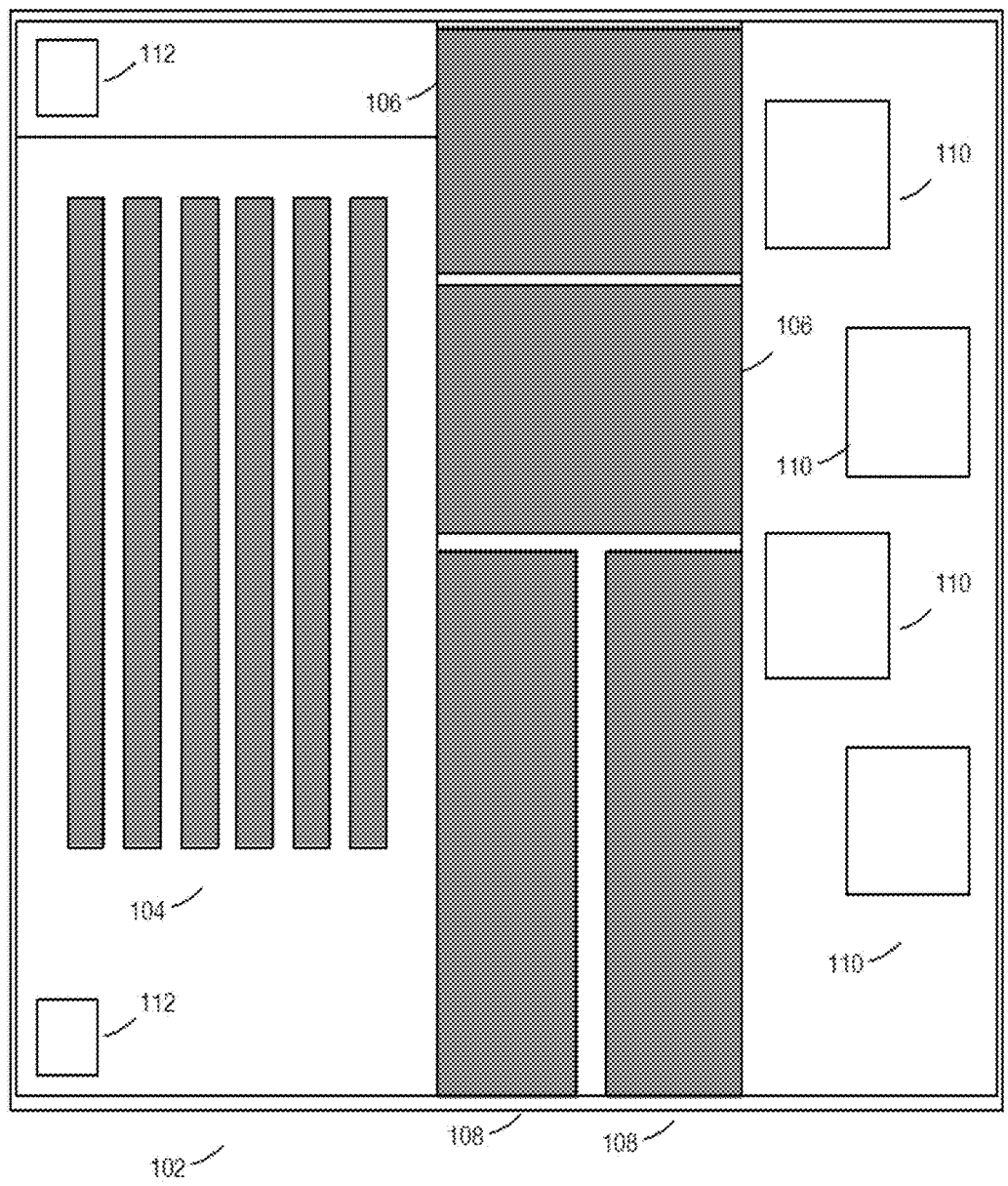
FIG. 1 is a top down view of a traditional back plane.

Various embodiments of the present technology are discussed in detail below. While specific implementations are discussed, it should be understood that this is done for illustration purposes only. A person skilled in the relevant art will recognize that other components and configurations may be used without departing from the spirit and scope of the present technology.

In server computing systems, a back plane (or backplane) is a group of electrical circuits and connectors which are configured to connect and manage multiple components in parallel with each other. A back plane typically takes the form of a circuit board, with multiple connectors for the multiple components. In the server environment, a back plane can be provided for a server rack. The back plane can include connectors to connect multiple chassis in the server rack to the back plane for communications purposes. The back plane can also include connectors for connecting to the power supply within each of the chassis. The power from the chassis can be supplied from the back plane to some devices corresponding to the chassis, such as fan modules, attached to the server rack. The back plane thus may also be responsible for supplying the power to the fan module and other devices crucial for the operation of the server rack. In other words, the rack back plane may be used to manage the operation of different chassis and other components in a server rack. As a result, a server rack back plane is essentially a computing device in its own right.

As noted above, in the case of a failure or fault, most conventional server rack back planes must be replaced with another back plane. However, that replacement typically requires shutting down the power supply for back plane and any components connected thereto. In some cases, this may mean that the power of the whole server rack must be shut down when the back plane is expected to be removed from the server rack, even though other back planes in the rack may be wholly operable. Further, as noted above, the fan modules may also be controlled by the rack back plane. Thus, even if power could be maintained for the chassis, the absence of cooling from the deactivated fans would place the powered chassis at risk for damage in the absence of proper cooling.

As noted above a server rack back plane is a computing device. Thus, a server rack back plane, like other types of computing devices, includes "strong" components and "weak" components for carrying out its functions. Strong components are electrical components which are not typically susceptible to damage or failure, while weak components are more susceptible to damage or failure. Such damage or failure in so-called weak components may be caused by voltage spikes, under-voltage, power surges, overloaded circuits, and more. Typical "strong" components can be passive components, including capacitors, resistors, inductors, transformers, diodes, and the like. That is, strong components can include passive components which cannot control the flow of energy by means of another electrical signal. Strong components may also include active components which are not commonly susceptible to damage or failure. However, weak components commonly include active components, as they are generally more prone to failure. Active components may include components that can control the flow of energy via electrical signals, such as transistors and components including transistors, e.g., control modules and integrated circuits.

Typically when a computing device fails, the failure is caused by failure of strong components. That is, since strong components are typically more sensitive to variations in voltage and current and are typically switching between different voltages and currents, they are typically more susceptible to damage due. In the case of a server rack back plane, these same types of failures are typically observed. For example, damaged integrated circuits are the leading cause of back plane failure. However, it is noted that such strong components are not typically involved in the supplying of power to components in a server rack. For example, power for a fan module is provided via a circuit consisting of weak, passive components.

In view of the foregoing, since strong components of the server rack back plane are typically not prone to failure, isolating the weak components from the strong components would allow the weak components to be replaced without removing the back plane strong components and power to devices such as fan modules.

In the present technology, strong components which are not susceptible to damage or failure are placed within a base plane board, while weak components more susceptible to failure are separately placed within a control module board. The control module board is able to be easily connected or disconnected from the base plane board and is hot-pluggable, meaning that it can be inserted or removed from the base plane board without shutting off power to the base plane board. In other words, this allows the control module board to be swapped in and out of the base plane board while still allowing the base plane board to continue to operate and draw power. This design has several benefits.

Primarily, this provides a great deal of flexibility in the operation and maintenance of the server. Whereas a traditional back plane design would involve shutting off the power to the entire chassis, back plane, and all of its components when the back plane fails and needs to be replaced, the separated back plane design does not require shutting off the power to the whole server chassis. Accordingly, since the back plane board of the present technology would generally be limited to strong components the base plane board can continue to operate when weak components fail. Moreover, other crucial components of the server system would continue to receive power and operate. For example, fans which provides essential cooling functions for the server system would continue to operate. Conversely, when weak components fail, those weak components are generally limited to the control module board. Thus, to replace the weak components, the control module board need only be swapped out and replaced while the base plane board continues to run. This is a great advantage over the previous traditional design, because it allows for zero or near-zero server downtime, minimized loss or corruption of data, continued operation of essential server components, and quick replacement of components in a plug-and-play fashion.

Although it is typical for "strong" and "weak" components to correspond to passive and active components, respectively, an active versus passive separation of components may not always make sense from a design and efficiency standpoint. Strong components may include, in some cases, active components that are not susceptible to failure or faults or that can be reset. That is, these "strong" active components may not need to be replaced every time there is a failure. Accordingly, in some configuration, these types of active components can be located on the base plane board since they needed to be replaced much less frequently than other, weaker components. In other words, the present design allows for dividing the components between the back plane board and the command module board so that only the most frequently replaced components are located on the command module board.

FIG. 1 is a top down view of a traditional back plane design that is useful for understanding how components can be divided between the back plane board and the command module board of the present technology. This illustration depicts a traditional back plane commonly found in servers with a unified back plane design, unlike the present invention. A back plane circuit board 102 fits into a server unit, and is connected to the chassis via chassis connectors 112. The back plane circuit board 102 contains a number of connectors which are capable of connecting components to the circuit board and activating them for functionality within the server. Input/output (I/O) slots 104 provide a number of slots for input/output boards to be inserted. In some embodiments, these may be PCI hot plug slots for networking cards and input/output devices.

A number of fan modules 106 may also be placed within the back plane board 102. Fan modules 106 can be considered strong, passive components which are not susceptible to failure. Further, it is crucial that they continue to operate in the event of failure of components or in the event a hot-swap needs to occur, as they provide essential cooling functions when the server is operating.

In this embodiment, two processor board connectors 108 provide connections for processor boards. These are weak, active components which may be prone to damage or failure.

Integrated circuit boards 110 may also be connected to the back plane board 102, and are also weak, active components which may be prone to damage or failure. In the traditional back plane design depicted, the failure of one of the integrated circuit boards 110 or one of the processor board connections 108 would result in the back plane as a whole to be removed, power to be shut off to the full back plane and full server, and maintenance or replacement of the failed component to occur. This results in server downtime, potential loss or corruption of data, and other technical problems.

As will be discussed, the present invention provides a solution to this in the form of a separated back plane design with separated strong components and weak components.

Figure 2:
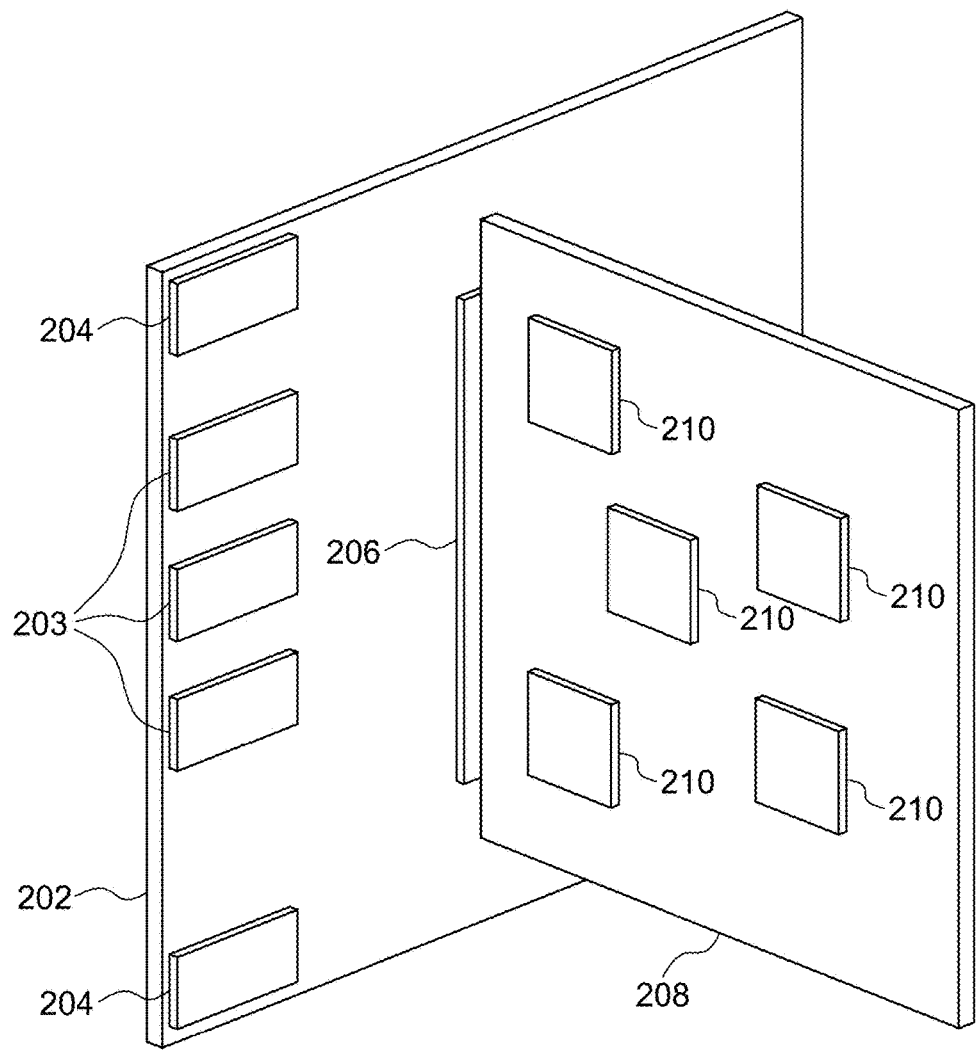
FIG. 2 is a schematic diagram of the separated server back plane, according to some embodiments.

FIG. 2 is a schematic diagram of a separated back plane design according to some embodiments. As shown in FIG. 2, a base plane 202 is a board constituting a portion of the separated back plane. The base plane 202 contains a number of electrical connectors for strong electrical components 203, including capacitors, resistors, and conductors. The base plane 202 can provide management of server functions. The base plane 202 can be connected to the server chassis via chassis connectors 204. Once the connection between the chassis and the base plane 102 is made, the base plane 202 need not be removed in most cases of back plane failure.

In some embodiments, the base plane 202 can include a connector for a power supply, which supplies electrical power for a number of components within the back plane. A connection to a power supply may be present via the connection to the server chassis which is facilitated by the chassis connectors 204. In some embodiments, the base plane 202 can also include one or more additional connections, including one or more connections to fan modules, which are important for server cooling functions.

Also present on the base plane 202 is a control module connector 206. The control module connector 206 provides a connection between the base plane board 202 and a control module board 208.

The control module board 208 is a board, such as a circuit board, which can be attached to the base plane 202 to be powered and for the components to be activated. The control module 208 contains one or more electrical connectors for a number of active components. In some embodiments, active components can be integrated circuits 210. In some embodiments, active components may be control components.

The separated back plane of FIG. 2 is designed to be hot-pluggable or hot-swappable. In particular, the control module board 208 can be removed from the control module connector 106 and replaced with another control module 208. When the control module board 208 is removed, the components and connections within the base plane board 202 continue to operate as normal. The base plane 202 also continues to draw power from a power supply without interruption. Thus, any crucial functions that are connected to the base plane board 202, such as the fan modules, continue to function while the control module board 208 is removed.

In some embodiments, the base plane board 202 may contain a bus buffer which allows for the insertion of the control module board 208 into the live, running base plane board 202 without any corruption of data or components. In other embodiments, surge protection may be present on the power supply to facilitate hot swapping. Hot swapping circuitry may be present to additionally facilitate the hot swapping of the control module board 208.

This system allows for uninterrupted functioning of the strong components of the back plane during many instances of back plane failure. Failures caused by weak components, including the integrated circuits on the control module board 208, can be fixed by removing and replacing the control module board 208, while the base plane 202 and its components continue to function normally. Thus, the separated back plane design allows for a hot-swappable control module board 208.

In some embodiments, multiple control module boards 208 may be present within a single base plane board 202. That is, more than one control module boards 208 may be active and connected to the base plane board 202, and each one may be hot-swappable while the strong components of the base plane board 202 continue to operate and draw power. This provides additional flexibility and strength in the event of failure.

In some embodiments, more than one of the same component can exist, as a backup component in case of failure of one of the components. In additional embodiments, such duplicate components can be present in both the base plane board 202 and the control module board 208. In some embodiments, even during the replacement of a component and the removal of a control module board 208, such a duplicate component can continue to operate without interruption on the base plane board 208 which continues to draw power from a power supply.

Figure 3:
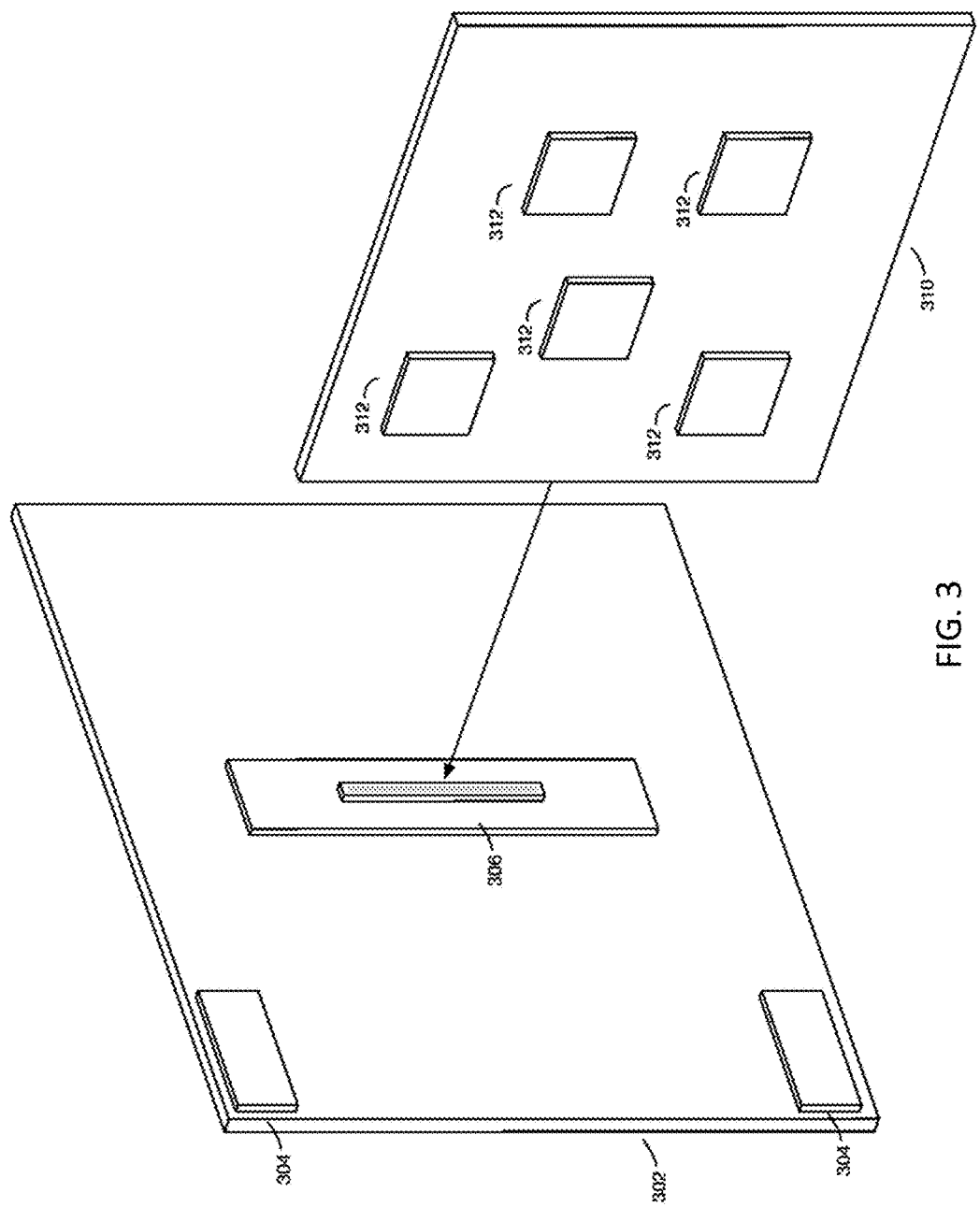
FIG. 3 is a schematic diagram illustrating the insertion of a control module board into a base plane within a separated back plane, according to some embodiments.

Turning now to FIG. 3, a schematic diagram of the separated back plane from FIG. 2 is illustrated, with the control module board 310 temporarily removed from the base plane board 302. As in FIG. 2, the separated back plane is illustrated with base plane board 302 and control module board 310. Chassis connectors 304 provide connection of the base plane board 302 to a server chassis and a power supply. A control module connector 306 on the base plane board 302 provides a connector for attaching a control module board 310, containing a number of integrated circuit components 312. However, the control module board 310 is disconnected from the control module connector 306. The base plane 310 continues to operate with the control module board 310 disconnected. The integrated circuits 312 and other components within the control module board 310 cease to function with the control module board 310 disconnected. However, with the base plane board and its crucial functions continuing to operate, the server can continue to run and be managed by the back plane in various ways.

Figure 4:
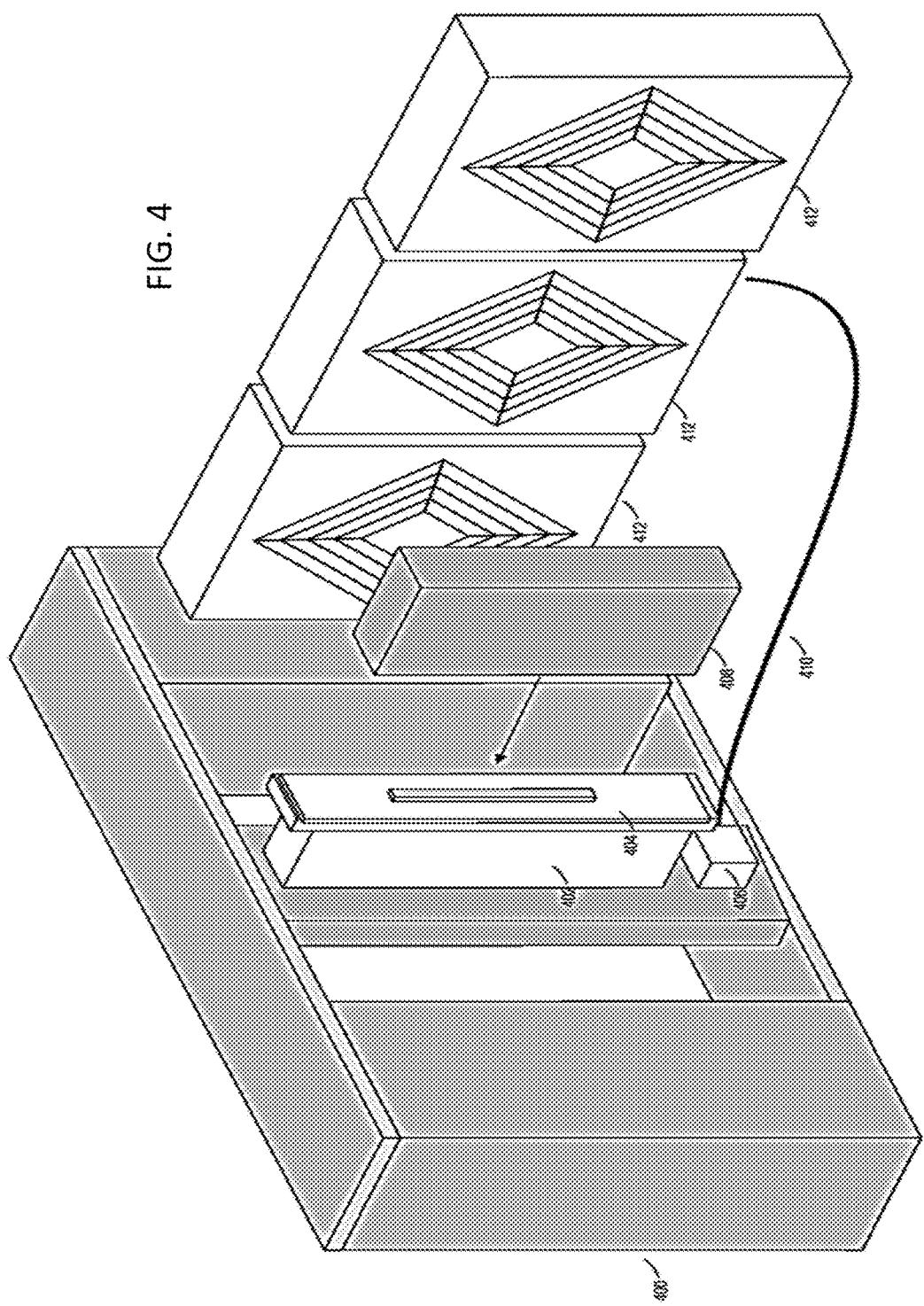
FIG. 4 is a schematic diagram of a separated server back plane with a connection to fan modules, according to some embodiments.

FIG. 4 is a schematic diagram illustrating the insertion of a control module board into a base plane within a separated back plane, according to some embodiments. Within FIG. 4, a base plane board 402 is connected to a server chassis 400 within a server rack. The base plane board 402 draws power from a power supply connected to the server chassis. A control module connector 404 provides a connection for a control module board 408. The control module board 408 contains a number of weak electrical components, such as a integrated circuits, which attach via a number of electrical connectors. In FIG. 4, the control module board 408 is not attached to the control module connector 404 on the base plane 402. In this embodiments, the base plane 402 also contains a strong electrical connector 406 for a fan module. A cable 410 connects the strong electrical connector 406 to a series of fan modules 412. In some embodiments, a single fan module 412 can be connected to the base plane 402, rather than a series of fan modules 412. In other embodiments, additional strong components can be connected to the base plane 402 via additional strong electrical connectors.

In the illustration of FIG. 4, the fan modules 412 continue to draw power from the base plane board 402, and continue to operate, despite the control module board 408 being disconnected. This illustrates the hot-swapping functionality of the separated back plane, allowing for the control module board 408 to be swapped in and out without turning off the power of the back plane or shutting off crucial functions such as fan modules, which provide important cooling functionality to avoid damage to the server rack. In common instances, one or more integrated circuits may burn out and may need to be replaced. This could lead to a failure within the control module board 408. Thus, the control module board 408 can be removed and fixed when one or more integrated circuits fail, and various server functions can continue to operate.

In some embodiments, the control module board 408 controls the duty cycle of the fan modules 412 during normal operations. The duty cycle can be controlled through an integrated circuit within the control module board 408. For greater CPU cooling needs, the duty cycle can be increased, and for lesser CPU cooling needs, the duty cycle can be decreased. In such an embodiment, during periods when the control module board 408 is removed and replaced, the circuit controlling the fan duty cycle will no longer function, and the fan modules 412 would no longer function. In some embodiments, however, the base plane board 402 contains a circuit that is operable to send a signal to the fan modules 412 when signals from the control module 408 are no longer being received. Thus, full functionality of the fan modules 412 can occur in the event of the control module board 408 no longer controlling the duty cycle of the fans.

In some embodiments, a single chassis 400 may contain multiple such back planes, with multiple base plane boards 402 and multiple control module boards 408. In additional embodiments, several chassis 400 may fit into a single server rack. In such embodiments, communication circuits for the several chassis 400 to be daisy-chained to a single rack may be present on the control module board 408. However, the base plane board 402 can be configured to provide a bypass circuit which is activated when the control module board 408 is removed. In this way, the communications between multiple chassis 400 can be maintained despite the control module board 408 being removed.

In additional embodiments, a single back plane may be present within a group of connected servers. Those with skill in the art will recognize that many different configurations and embodiments are possible within the design of the separated back plane of the present invention.

Although the foregoing examples have been described in some detail for purposes of clarity of understanding, the above-described inventive techniques are not limited to the details provided. There are many alternative ways of implementing the above-described invention techniques. The disclosed examples are illustrative and not restrictive.

What is claimed is:

1. A back plane system, comprising:
a plurality of components comprising a plurality of strong components and a plurality of weak components, wherein the plurality of strong components includes passive electronic components incapable of controlling energy flow through a circuit and being not susceptible to failure, or is capable of being reset after failure;
a base plane board supporting the plurality of strong components and comprising a plurality of connectors electrically coupled to the plurality of strong components, the plurality of strong components comprising capacitors, resistors, and conductors; and
a control module board supporting the plurality of weak components and comprising at least one control module connector electrically coupled to the plurality of weak components, the at least one control module connector configured to engage with at least one of the plurality of connectors, the plurality of weak components comprising transistors,
wherein, upon engaging with the at least one of the plurality of connectors, the plurality of strong components and the plurality of weak components are coupled to define a back plane system, and wherein the control module is hot-swappable,
wherein the base plane board does not include any of the plurality of weak components.

2. The back plane system of claim 1, wherein the base plane board is connected to a chassis via one or more chassis connectors.

3. The back plane system of claim 1, wherein the plurality of strong components comprises a fan module.

4. The back plane system of claim 3, wherein the fan module continues to operate if the control module board is removed.

5. The back plane system of claim 1, wherein the plurality of strong components comprises a power supply module.

6. The back plane system of claim 5, wherein the control module board can be replaced without shutting down the power supply module.

7. The back plane system of claim 1, wherein the failure of the control module board or the plurality of weak components does not affect the operation of the plurality of strong components.

8. The back plane system of claim 1, wherein the plurality of weak components comprises a control component.

9. A back plane system adapted for a server chassis, comprising:
a plurality of components comprising a plurality of strong components and a plurality of weak components, wherein the plurality of strong components includes passive electronic components incapable of controlling energy flow through a circuit and being not susceptible to failure, or is capable of being reset after failure;
a base plane board electrically coupled to the server chassis via one or more chassis connectors, supporting the plurality of strong components and comprising a plurality of connectors electrically coupled to the plurality of strong components, the plurality of strong components comprising capacitors, resistors, and conductors; and
a control module board electrically coupled to the base plane board, supporting the plurality of weak components and comprising at least one control module connector electrically coupled to the plurality of weak components, the at least one control module connector configured to engage with at least one of the plurality of connectors, the plurality of weak components comprising transistors,
wherein, upon engaging with the at least one of the plurality of connectors, plurality of strong components and the plurality of weak components are coupled to define a back plane system, and wherein the control module is hot-swappable,
wherein the base plane board does not include any of the plurality of weak components.

10. The back plane of claim 9, wherein the plurality of strong components comprises a fan module.

11. The back plane of claim 10, wherein the fan module continues to operate if the control module board is removed.

12. The back plane of claim 9, wherein the plurality of strong components comprises a power supply module.

13. The back plane of claim 12, wherein the control module board can be replaced without shutting down the power supply module.

14. The back plane of claim 9, wherein the failure of the control module board or the plurality of weak components does not affect the operation of the plurality of strong components.

15. The back plane of claim 9, wherein the plurality of weak components comprises a control component.

16. A back plane system adapted for a server chassis, comprising:
   a plurality of components comprising a plurality of strong components and a plurality of weak components, wherein the plurality of strong components includes passive electronic components incapable of controlling energy flow through a circuit and being not susceptible to failure, or is capable of being reset after failure;
   a base plane board electrically coupled to the server chassis via one or more chassis connectors, supporting the plurality of strong components and comprising a plurality of connectors electrically coupled to the plurality of strong components, the plurality of strong components comprising capacitors, resistors, and conductors; and
   a control module board electrically coupled to the base plane board, supporting the plurality of weak components and comprising at least one control module connector electrically coupled to the plurality of weak components, the at least one control module connector configured to engage with at least one of the plurality of connectors, the plurality of weak components comprising transistors,
   wherein, upon engaging with the at least one of the plurality of connectors, the plurality of strong components and the plurality of weak components are coupled to define a back plane system, and wherein the control module is hot-swappable,
   wherein the base plane board does not include any of the plurality of weak components.

17. The back plane of claim 16, wherein the plurality of strong components comprises a fan module, the fan module continues to operate if the control module board is removed.

18. The back plane of claim 16, wherein the plurality of strong components further comprises a power supply module.

19. The back plane of claim 18, wherein the control module board can be replaced without shutting down the power supply module.

20. The back plane of claim 16, wherein the failure of the control module board or the plurality of weak components does not affect the operation of the plurality of strong components.

21. The back plane of claim 16, wherein the plurality of weak components comprises a control component.

\* \* \* \* \*